(12) United States Patent
Yang et al.

(10) Patent No.: US 7,098,718 B2
(45) Date of Patent: Aug. 29, 2006

(54) TUNABLE CURRENT-MODE INTEGRATOR FOR LOW-FREQUENCY FILTERS

(75) Inventors: Zibing Yang, Natick, MA (US); Todd A. Hinck, Arlington, MA (US); Howard I. Cohen, Waltham, MA (US); Allyn Hubbard, Medfield, MA (US)

(73) Assignee: The Trustees of Boston University, Boston, MA (US)

( * ) Notice: Subject to any disclaimer, the term of this patent is extended or adjusted under 35 U.S.C. 154(b) by 53 days.

(21) Appl. No.: 11/009,377

(22) Filed: Dec. 10, 2004

(65) Prior Publication Data

US 2005/0195013 A1  Sep. 8, 2005

Related U.S. Application Data

(60) Provisional application No. 60/528,910, filed on Dec. 11, 2003.

(51) Int. Cl.
*H06G 7/19* (2006.01)
(52) U.S. Cl. .................. 327/336; 327/552; 327/553; 327/558
(58) Field of Classification Search .......... None
See application file for complete search history.

(56) References Cited

U.S. PATENT DOCUMENTS

| | | | | |
|---|---|---|---|---|
| 5,389,839 A | * | 2/1995 | Heck | 327/307 |
| 5,530,399 A | * | 6/1996 | Chambers et al. | 327/561 |
| 6,278,321 B1 | * | 8/2001 | Franck | 330/254 |
| 6,335,655 B1 | * | 1/2002 | Yamamoto | 327/552 |
| 6,636,098 B1 | * | 10/2003 | Kizer | 327/345 |
| 6,664,854 B1 | * | 12/2003 | Tanaka et al. | 330/258 |
| 6,677,822 B1 | * | 1/2004 | Hasegawa | 330/258 |
| 6,930,544 B1 | * | 8/2005 | Yokoyama | 327/552 |

* cited by examiner

*Primary Examiner*—Tuan T. Lam
*Assistant Examiner*—Hiep Nguyen
(74) *Attorney, Agent, or Firm*—Weingarten, Schurgin, Gagnebin & Lebovici LLP

(57) ABSTRACT

A tunable current mode integrator for low-frequency continuous-time filters that requires a reduced amount of area when implemented in an integrated circuit (IC). The integrator includes input and output transistors, and cross-coupled current mirrors, integration capacitors, and operational transconductance amplifiers (OTAs) that form a feedback structure with the input transistors. Input currents are converted to small current swings within the OTAs, and are subsequently integrated by the capacitors. Resulting integrated voltages are converted to output currents by the output transistors.

12 Claims, 4 Drawing Sheets

TUNABLE CURRENT-MODE INTEGRATOR FOR LOW-FREQUENCY FILTERS

CROSS REFERENCE TO RELATED APPLICATIONS

This application claims priority of U.S. Provisional Patent Application No. 60/528,910 filed Dec. 11, 2003 entitled A TUNABLE CURRENT-MODE INTEGRATOR FOR LOW-FREQUENCY FILTERS.

STATEMENT REGARDING FEDERALLY SPONSORED RESEARCH OR DEVELOPMENT

This invention was made with government support under U.S. Government Contract Nos. N00014-01-1-0178 and N00014-00-C-0314 awarded by the Office of Naval Research (ONR). The government has certain rights in the invention.

BACKGROUND OF THE INVENTION

The present application relates generally to low-frequency continuous-time filters, and more specifically to integrators for low-frequency continuous-time filters that can be implemented in integrated circuits.

In recent years, there has been an increasing need for continuous-time filters that can be implemented in integrated circuits (ICs). By implementing functional circuit components such as filters in ICs, significant reductions in the size, cost, and complexity of a target system can be achieved. A conventional continuous-time filter implementable in an IC is the transconductor-capacitor (gm-C) filter, in which "gm" represents the transconductance of a transconductor and "C" represents the capacitance of a capacitor. The conventional gm-C filter includes one or more gm-C integrators. Each gm-C integrator typically operates in the current mode, i.e., both the input and output signals of the gm-C integrator take the form of currents. Such gm-C filters have been widely used in low-voltage high-frequency applications such as cellular telephones. For example, in cellular telephones, integrated gm-C filters may be employed to reconstruct received signals, and to perform anti-aliasing prior to signal transmission.

Not only is there a need for integratable continuous-time filters in high-frequency applications, but there is also a need for integratable continuous-time filters in low-frequency applications. Such low-frequency applications include biomedical systems that sense and process bioelectrical signals and that require filters having cutoff frequencies below 100 Hz; speech recognition systems and sound detecting/processing devices such as hearing aids that require filters operating in the audio frequency range; and, seismic and machine surveillance systems that require low-frequency filters for monitoring and for analyzing signals with frequencies typically ranging from about 0.1 Hz to 100 Hz. Low-frequency signal processing is also employed in some medium to high-frequency applications such as averaging filters in root mean square (RMS) detectors, automatic gain control (AGC) circuits, and phase locked loop (PLL) circuits.

However, using gm-C filters in low-frequency applications can be problematic, especially when implementing the filters in an IC. This is because in low-frequency applications, it is generally desirable to use gm-C filters that have a low transconductance. For a typical gm-C integrator, however, the transconductance of the transconductor is inversely proportional to the capacitance of the capacitor. As a result, as the transconductance of the gm-C integrator is reduced, the amount of area required to implement the capacitor is increased, thereby reducing the amount of area available for the gm-C filter and other circuits in the IC. Although the larger capacitance of the low-frequency gm-C integrator may be implemented using one or more components external to the IC, such use of external components typically increases the size, cost, and/or complexity of the target system.

It would therefore be desirable to have an integrator suitable for use in low-frequency continuous-time filters and implementable in an IC that avoids the shortcomings of the above-described conventional gm-C integrator.

BRIEF SUMMARY OF THE INVENTION

In accordance with the present invention, a tunable current mode integrator for low-frequency continuous-time filters is provided that requires a reduced amount of silicon area when implemented in an integrated circuit (IC). In one embodiment, the tunable current mode integrator includes a first section and a second section. Each one of the first and second sections includes first, second, and third transistors, first, second, and third current sources, an operational transconductance amplifier (OTA), and an integration capacitor. The first, second, and third current sources are configured to provide. bias currents to the first, second, and third transistors, respectively. The first current source and the first transistor are connected to each other at a first node, the second current source and the second transistor are connected to each other at a second node, and the third current source and the third transistor are connected to each other at a third node of the integrator. The OTA of each section has an inverting input, a non-inverting input, and an output. The non-inverting input of the OTA is connected to the first node, and the inverting input of the OTA is connected to a DC reference voltage. The integration capacitor of each section is connected between the output of the OTA and ground potential. Each OTA has a single voltage input for tuning the transconductance of the OTA. Further, each one of the first, second, and third transistors has a control electrode, which is connected to a fourth node of the integrator between the OTA output and the integration capacitor.

In the presently disclosed embodiment, the first and second sections of the integrator are cross-coupled to each other. Specifically, the second node between the second current source and the second transistor of the first section is coupled to the first node between the first current source and the first transistor of the second section. Similarly, the second node of the second section is coupled to the first node of the first section. Differential input currents are supplied to the first nodes of the respective sections of the integrator. In addition, the third nodes between the third current sources and the third transistors of the respective sections are used for outputting differential output currents from the integrator. Accordingly, the first nodes of the respective sections operate as input nodes, and the third nodes of the respective sections operate as output nodes of the integrator.

The cross-coupled configuration of the tunable current mode integrator forms feedback paths that clamp the input node voltages at about the level of the reference voltage. As a result, the differential input currents are converted to voltages having relatively small voltage swings, which are subsequently converted to currents by the OTAs. The output currents of the OTAs are then integrated by the integration capacitors. The resulting voltages are provided to the respective control electrodes of the first, second, and third transistors, and are subsequently converted to the differential output currents at the output nodes of the integrator.

The cross-coupled configuration of the presently disclosed tunable current mode integrator allows low cutoff frequencies (e.g., down to less than 1 Hz) to be achieved using relatively small transistors and capacitors. Further, both the dynamic range and the unity gain crossover frequency of the integrator can be controlled separately. Moreover, the frequency of the integrator can be adjusted or tuned using a single control voltage. The tunable current mode integrator may be employed as a building block or cell for implementing low-frequency low pass, high pass, or band pass filters in an IC.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/528,910 filed Dec. 11, 2003 entitled A TUNABLE CURRENT-MODE INTEGRATOR FOR LOW-FREQUENCY FILTERS is incorporated herein by reference.

Figure 1:
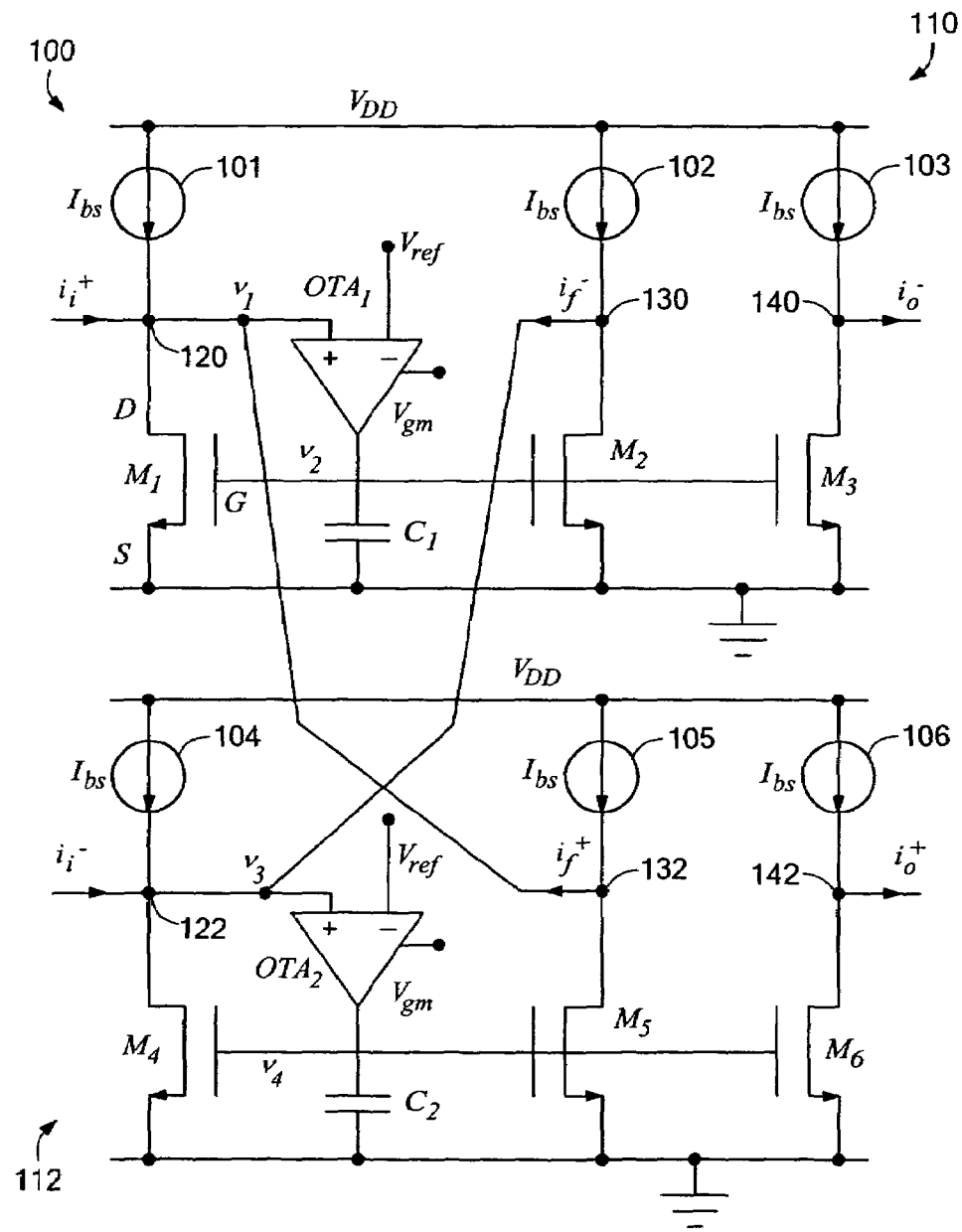
FIG. 1 is a schematic diagram of a tunable current mode integrator according to the present invention.

A tunable current mode integrator for low-frequency continuous-time filters is disclosed that requires a reduced amount of area when implemented in an integrated circuit (IC). FIG. 1 depicts an illustrative embodiment of a tunable current mode integrator 100, in accordance with the present invention. In the illustrated embodiment, the integrator 100 comprises first and second sections 110 and 112. The first section 110 of the integrator 100 includes a plurality of current sources 101–103, a plurality of transistors M1–M3, an operational transconductance amplifier 1 (OTA1), and an integration capacitor C1. Similarly, the second section 112 of the integrator 100 includes a plurality of current sources 104–106, a plurality of transistors M4–M6, an operational transconductance amplifier 2 (OTA2), and an integration capacitor C2. In the presently disclosed embodiment, each one of the transistors M1–M6 is implemented as an n-channel MOS (NMOS) transistor, and the current sources 101–106 and the OTAs 1–2 are also fabricated using MOS technology. It should be understood, however, that the tunable current mode integrator 100 may be fabricated using MOS technology, bipolar technology, or any other suitable semiconductor technology.

As shown in FIG. 1, the current sources 101–106 are connected between a positive power supply VDD and the drain electrodes of the transistors M1–M6, respectively. The current sources 101–106 are configured to provide bias currents to the transistors M1–M6, respectively. For example, each one of the current sources 101–106 may be implemented as a current mirror. It is noted that each MOS transistor M1–M6 has a drain electrode (D), a source electrode (S), and a gate or control electrode (G), as indicated with reference to the transistor M1. The source electrodes of the respective transistors M1–M6 are connected to ground potential, the gate electrodes of the respective transistors M1–M3 are connected to the output of the OTA1, and the gate electrodes of the respective transistors M4–M6 are connected to the output of the OTA2. In addition, the integration capacitor C1 is connected between the output of the OTA1 and ground, and the integration capacitor C2 is connected between the output of the OTA2 and ground.

The non-inverting input of the OTA1 is connected to the drain electrode of the transistor M1 of the first section 110, and the non-inverting input of the OTA2 is connected to the drain electrode of the transistor M4 of the second section 112. The inverting inputs of the respective OTAs 1–2 are connected to a DC reference voltage Vref. Each one of the OTAs 1–2 has an input for a voltage Vgm, which is used to adjust or tune the transconductance of the respective OTA.

The drain electrodes of the respective transistors M1 and M4 correspond to input nodes 120 and 122 of the integrator 100. As shown in FIG. 1, differential input currents $i_i^+$ and $i_i^-$ are supplied to the input nodes 120 and 122, respectively. Moreover, the drain electrodes of the respective transistors M3 and M6 correspond to output nodes 140 and 142 of the integrator 100. As shown in FIG. 1, differential output currents $i_o^-$ and $i_o^+$ are provided at the output nodes 140 and 142, respectively. Accordingly, the integrator 100 operates in the current mode, i.e., both the input signals (i.e., the differential input currents $i_i^+$ and $i_i^-$) and the output signals (i.e., the differential output currents $i_o^-$ and $i_o^+$) take the form of currents.

In the presently disclosed embodiment, the first and second sections 110 and 112 of the integrator 100 are cross-coupled to each other. Specifically, the drain electrode of the transistor M2 of the first section 110 is connected to the drain electrode of the transistor M4 of the second section 112. Further, the drain electrode of the transistor M1 of the first section 110 is connected to the drain electrode of the transistor M5 of the second section 112. As shown in FIG. 1, differential feedback currents $i_f^-$ and $i_f^+$ are fed back from the drain electrode of the transistor M2 (node 130) to the drain electrode of the transistor M4 (the input node 122), and from the drain electrode of the transistor M5 (node 132) to the drain electrode of the transistor M1 (the input node 120), respectively.

The cross-coupled configuration of the tunable current mode integrator 100 forms feedback paths operative to clamp voltages v1 and v3 at the input nodes 120 and 122, respectively, at about the level of the reference voltage Vref. It is also noted that the input impedance of the integrator 100 is relatively low, e.g., typically lower than that of a diode-connected transistor. As a result, the differential input currents $i_i^+$ and $i_i^-$ are converted to the voltages v1 and v3, respectively, which have relatively small voltage swings. The voltages v1 and v3 are subsequently converted to currents by the OTAs 1–2, respectively. The output currents of the OTAs 1–2 are integrated by the integration capacitors C1–C2, respectively, thereby producing voltages v2 and v4 at the outputs of the OTAs 1–2. The voltage v2 is applied to the gate electrodes of the transistors M1–M3, and the voltage v4 is applied to the gate electrodes of the transistors M4–M6, thereby causing current to flow between the drain and source electrodes of the respective transistors. Specifically, the voltages v2 and v4 are applied to the gate electrodes of the transistors M3 and M6, respectively, to produce the differential output currents $i_o^-$ and $i_o^+$.

Figure 2:
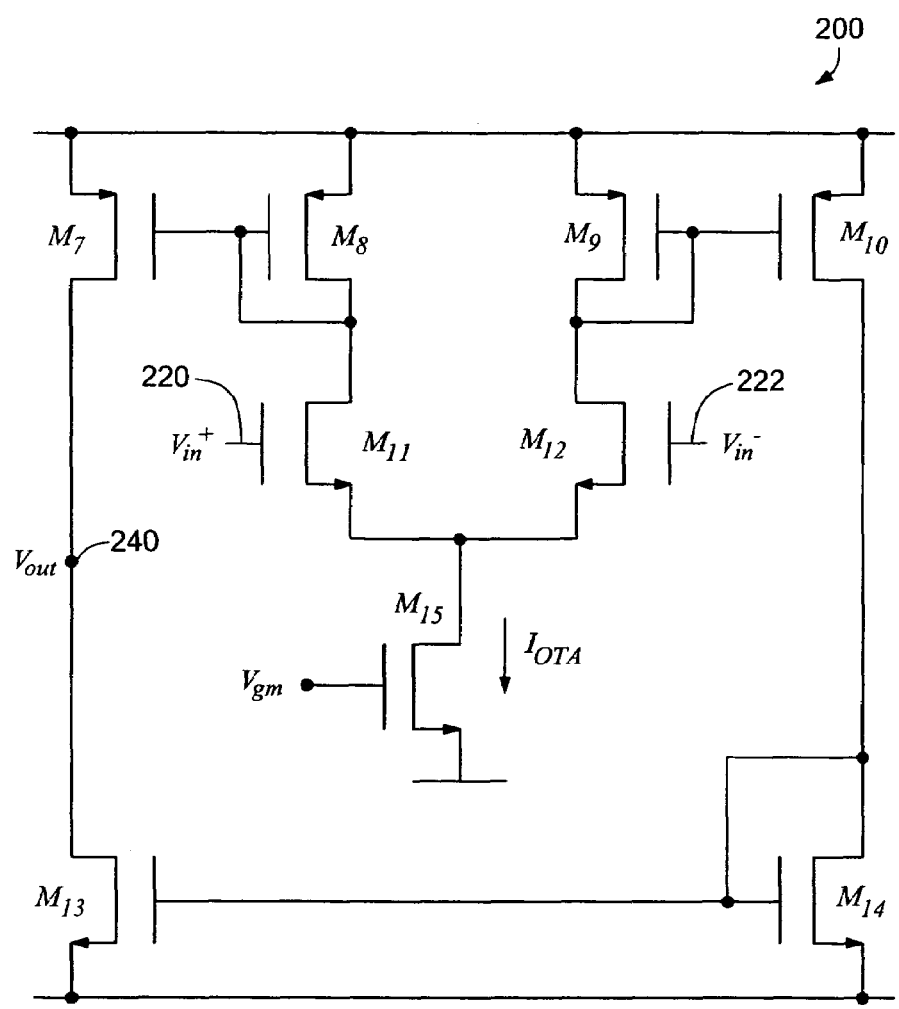
FIG. 2 is a schematic diagram of an operational transconductance amplifier (OTA) included in the tunable current mode integrator of FIG. 1.

FIG. 2 depicts an illustrative embodiment of an operational transconductance amplifier (OTA) 200, which may be employed as the OTAs 1–2 in the tunable current mode integrator 100 (see FIG. 1). As shown in FIG. 2, the OTA 200 includes a plurality of p-channel MOS (PMOS) transistors M7–M10, and a plurality of n-channel MOS (NMOS) transistors M11–M15. Further, the diode-connected input transistor M8 and the output transistor M7 are configured to form a first current mirror, the diode-connected input transistor M9 and the output transistor M10 are configured to form a second current mirror, and the diode-connected input transistor M14 and the output transistor M13 are configured to form a third current mirror. Differential input voltages $V_{in}^+$ and $V_{in}^-$ are applied to the gate electrodes (input nodes 220 and 222) of the transistors M11–M12, respectively, and an output voltage Vout is provided at an output node 240. In addition, the voltage Vgm is applied to the gate electrode of the transistor M15. As described above, the transconductance of the OTA 200 can be tuned by adjusting the voltage Vgm, which controls a bias current $I_{OTA}$ of the OTA 200.

Figure 3:
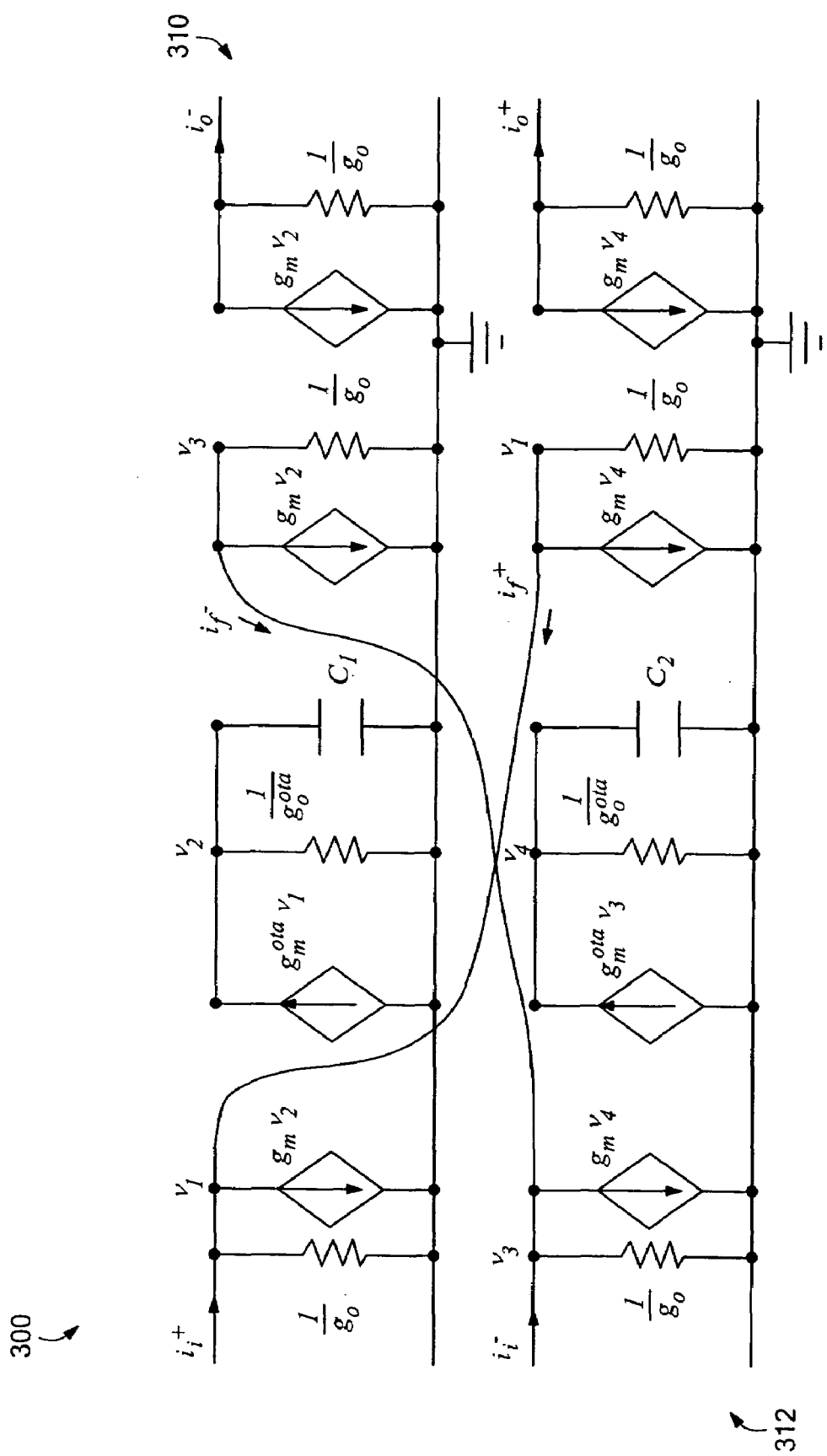
FIG. 3 is schematic diagram of a small signal model of the tunable current mode integrator of FIG. 1.

FIG. 3 depicts a small signal model 300 of the integrator 100 (see FIG. 1). As shown in FIG. 3, the small signal model 300 includes a first small signal model 310 corresponding to the first section 110, and a second small signal model 312 corresponding to the second section 112 of the integrator 100. Differential input currents $i_i^+$ and $i_i^-$, differential output currents $i_o^-$ and $i_o^+$, differential feedback currents $i_f^-$ and $i_f^+$, and voltages v1–v4, as indicated in FIG. 3, therefore correspond to the differential input currents $i_i^+$ and $i_i^-$, the differential output currents $i_o^-$ and $i_o^+$, the differential feedback currents $i_f^-$ and $i_f^+$, and the voltages v1–v4 indicated in FIG. 1. It is noted that each one of the transistors M1–M6 has a transconductance $g_m$ and an output conductance $g_o$, and that each one of the OTAs 1–2 has a transconductance $g_m^{ota}$ and an output conductance $g_o^{ota}$.

The presently disclosed tunable current mode integrator 100 will be better understood by reference to the following analysis of the small signal model 300 (see FIG. 3). In this analysis, the respective transistors M1–M6 have identical sizes and equivalent bias currents. For each transistor M1–M6, the transconductance $g_m$ is therefore equal to the output conductance $g_o$; and, for each OTA 1–2, the transconductance $g_m^{ota}$ is equal to the output conductance $g_o^{ota}$. In addition, the differential feedback currents $i_f^-$ and $i_f^+$ are equal to the differential output currents $i_o^-$ and $i_o^+$, respectively.

Accordingly, based on the small signal model 300, the differential mode gain $A_{dd}$ may be expressed as $$A_{dd} = \frac{i_o^+ - i_o^-}{i_i^+ - i_i^-} = \frac{1}{s\frac{2g_oC}{g_m g_m^{ota}}} = \frac{\omega_u}{s}, \quad (1)$$

in which "$\omega_u$" is the unity gain frequency. Further, the common mode gain $A_{CM}$ may be expressed as $$A_{CM} = \frac{i_o^+ + i_o^-}{i_i^+ + i_i^-} = \frac{-1}{2 + s\frac{2g_oC}{g_m g_m^{ota}}} = \frac{-1}{2 + \frac{s}{\omega_u}}. \quad (2)$$

Moreover, the unity gain frequency $\omega_u$ may be expressed as $$\omega_u = \frac{g_m g_m^{ota}}{2g_oC}. \quad (3)$$

In the preferred embodiment, the transistors M1–M6 are biased in saturation, and the transconductance $g_m$ of the transistors M1–M6 is relatively high. Further, the current sources 101–106 (see FIG. 1) are configured to provide bias currents large enough to assure that the integrator 100 can handle large signal currents without introducing a significant amount of harmonic distortion.

It is noted that the input voltage Vgm of the OTAs 1–2 can be adjusted to make the transconductance $g_m^{ota}$ low enough to obtain a low unity gain frequency. In the preferred embodiment, the OTAs 1–2 employ a MOSFET sub-threshold biasing scheme to obtain the desired low transconductance $g_m^{ota}$. Those of ordinary skill in this art will appreciate that such sub-threshold biasing schemes, in which the MOS transistors are configured to operate in the sub-threshold region, are particularly useful in low-power low-voltage applications that employ MOS transistors as current sources. Biasing the OTAs 1–2 using the sub-threshold biasing scheme also facilitates frequency compensation of the integrator 100. For example, the transistor M1 and the OTA1 (and the transistor M4 and the OTA2) form a unity gain feedback loop, and about a 60° phase margin may be obtained by connecting relatively small capacitances, e.g., about 100 fF in an AMI 1.2 μm CMOS process, between the drain and gate electrodes of the transistor M1 (and between the drain and gate electrodes of the transistor M4).

As indicated above, the transconductance $g_m^{ota}$ of the OTAs 1–2 can be made low enough to obtain a low unity gain frequency. Because the transconductance $g_m^{ota}$ is low, the OTAs 1–2 employ relatively small bias currents. Nevertheless, the dynamic range of the integrator 100 is not limited because, as described above, the differential input currents $i_i^+$ and $i_i^-$ are converted to the voltages v1 and v3, respectively, which have small voltage swings. As a result, the current swings within the OTAs 1–2 are relatively small. By configuring the OTAs 1–2 such that the current swings within the OTAs are smaller than the bias current levels of the OTAs, degradation of the dynamic range of the integrator 100 can be avoided.

As also indicated above, the transconductance $g_m$ of the transistors M1–M6 is relatively high. Because, in this analysis, the transconductance $g_m$ is equal to the output conductance $g_o$ for each of the transistors M1–M6, the output conductance $g_o$ is relatively high. The high output conductance $g_o$ of the transistors M1–M6 and the low input impedance of the integrator 100 obviate the need for configuring the current mirrors 101–106 as cascode structures, thereby allowing the current sources 101–106 to be implemented as simple 2-transistor current mirrors.

It should be appreciated that the integrator 100 may be employed as a building block or cell for implementing low-frequency current mode low pass, high pass, and band pass filters in an IC. For example, multiple integrator cells can be arranged in successive stages to form a low-frequency current mode filter. It is noted that current replication in such multi-stage filter arrangements is highly accurate, even when simple current mirrors are employed. This is because the transistors M1–M6 have substantially the same drain-to-source voltages (Vds) due to the voltage clamping effect of the successive integrator cell stages.

For example, the presently disclosed tunable current mode integrator 100 (see FIG. 1) can be used in five successive cell stages to construct a fifth order Butterworth low pass filter. In this illustrative example, the low pass filter is fabricated in an IC using an AMI 1.2 μm n-well CMOS process. Further, the capacitance of the integration capacitors ranges from about 6.5 pF to 20.8 pF. Moreover, a single voltage source is used to adjust the input voltage Vgm of the OTAs 1–2 and to set the OTA bias currents, thereby tuning the unity gain frequency and the cutoff frequency of the filter. Specifically, the low pass filter is biased with a current level of about 100 μA. In addition, the positive power supply voltage VDD is 5 volts, the power dissipation is about 20 mW, and the active area of the filter is about 0.08 mm$^2$/pole, including the integration capacitors.

Figure 4:
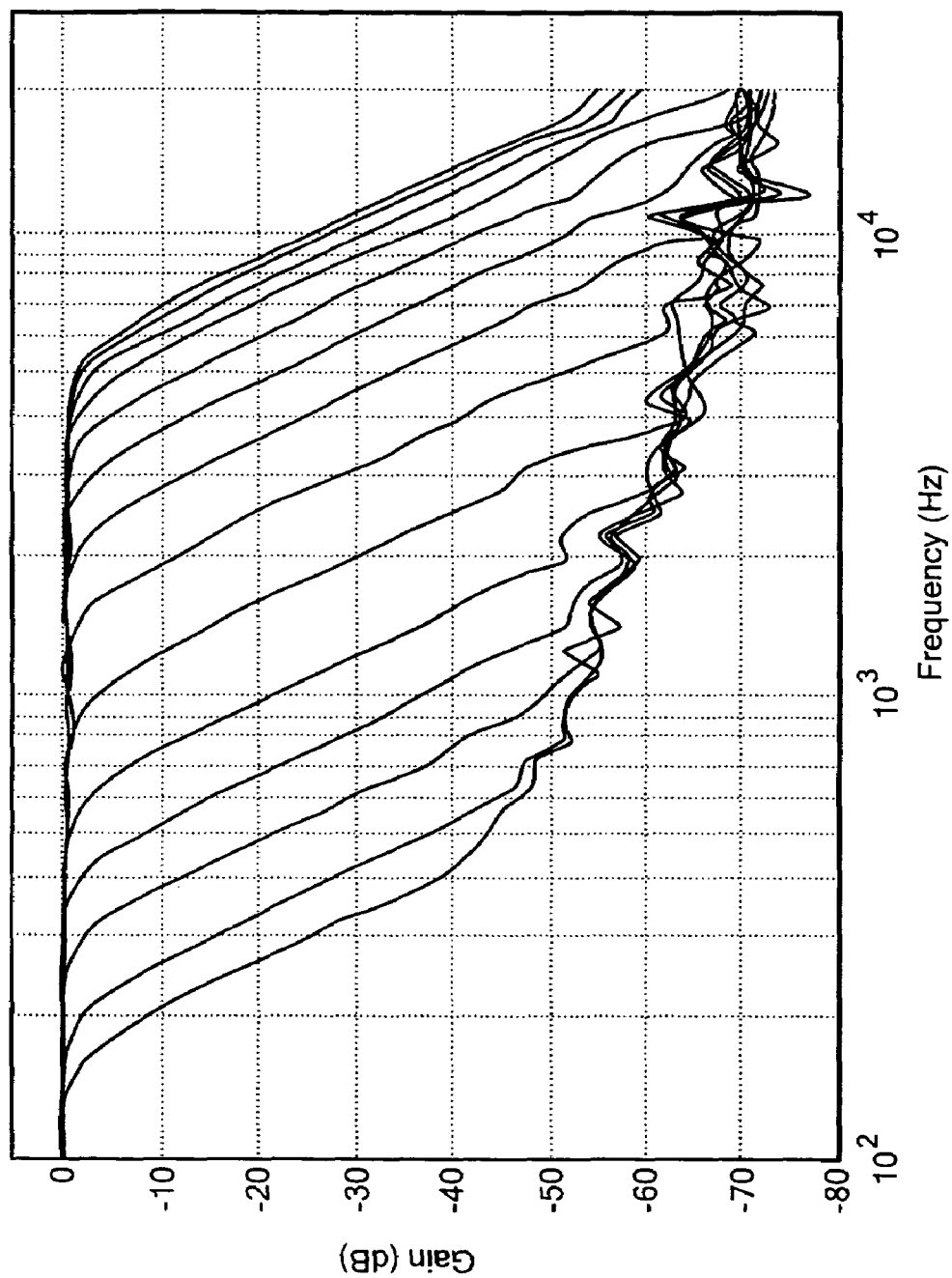
FIG. 4 is a diagram of the frequency response of a fifth order Butterworth low pass filter constructed using the tunable current mode integrator of FIG. 1.

FIG. 4 depicts the frequency response of the above-described fifth order Butterworth low pass filter. As shown in FIG. 4, the low pass filter achieves −3 dB cutoff frequencies in the audio frequency range. Further, the cutoff frequency can be varied between 160 Hz and 5.6 kHz by adjusting the input voltage Vgm. For example, as the level of the input voltage Vgm is increased, the curves of FIG. 4 shift from left to right. It is noted that the cutoff frequency does not increase exponentially as the level of Vgm approaches or exceeds the threshold voltage of the bias transistors within the OTAs 1–2. It is also noted that the noise floor increases as the frequency is reduced, as depicted in FIG. 4. This is caused by operational amplifiers included in the test circuitry (not shown) employed in this illustrative example.

It will be appreciated by those of ordinary skill in the art that further modifications to and variations of the above-described tunable current mode integrator for low-frequency filters may be made without departing from the inventive concepts disclosed herein. Accordingly, the invention should not be viewed as limited except as by the scope and spirit of the appended claims.

What is claimed is:

1. A current mode integrator, comprising:
    first and second sections, each section including first, second, and third current sources;
    first, second and third transistors;
    an operational transconductance amplifier (OTA); and
    an integration capacitor,
    wherein the first current source is connected to the first transistor at an input node, the second current source is connected to the second transistor at a second node, and the third current source is connected to the third transistor at an output node, and each current source is configured to provide a bias current to the respective transistor connected thereto,
    wherein the OTA has a non-inverting input connected to the input node, an inverting input connected to a reference voltage, and an output connected to respective control electrodes of the first, second, and third transistors and to the integration capacitor,
    wherein the input node of the first section is connected to the second node of the second section, and the input node of the second section is connected to the second node of the first section, and
    wherein the input nodes of the first and second sections are configured to receive differential input currents, respectively, and the output nodes of the first and second sections are configured to provide differential output currents, respectively.

2. The current mode integrator of claim 1 wherein each one of the OTAs of the first and second sections has a voltage input for adjusting a transconductance of the respective OTA.

3. The current mode integrator of claim 1 wherein each one of the OTAs of the first and second sections includes a plurality of transistors biased to operate in a sub-threshold region of operation.

4. The current mode integrator of claim 1 wherein the first, second, and third current sources comprise respective current mirrors.

5. The current mode integrator of claim 1 wherein each section further includes a compensation capacitor coupled between the input node and the control electrode of the first transistor.

6. The current mode integrator of claim 1 wherein the first, second, and third current sources are configured to provide substantially equal levels of bias current to the first, second, and third transistors, respectively.

7. The current mode integrator of claim 1 wherein the first, second, and third transistors have substantially equal transconductance.

8. The current mode integrator of claim 1 wherein the first, second, and third transistors have substantially equal output conductance.

9. The current mode integrator of claim 1 wherein each one of the first, second, and third transistors has a transconductance and an output conductance, the transconductance being substantially equal to the output conductance.

10. The current mode integrator of claim 1 wherein each one of the OTAs of the first and second sections has a transconductance and an output conductance, the transconductance being substantially equal to the output conductance.

11. The current mode integrator of claim 1 wherein each one of the integration capacitors of the first and second sections has a capacitance ranging from about 6.5 pF to 20.8 pF.

12. The current mode integrator of claim 1 wherein the current sources, the transistors, the OTAs, and the integration capacitors of each section are fabricated using a semiconductor technology selected from the group consisting of MOS technology and bipolar technology.

* * * * *